United States Patent [19]

Hisamatsu et al.

[11] 3,891,523

[45] June 24, 1975

[54] PHOTOPOLYMERIZABLE, ISOCYANATE-CONTAINING PREPOLYMERS

[75] Inventors: Hiroyoshi Hisamatsu, Saitama-ken; Katutoshi Takahashi; Masanori Takase, both of Urawa, all of Japan

[73] Assignee: Dainippon Ink & Chemicals Inc., Tokyo, Japan

[22] Filed: July 3, 1974

[21] Appl. No.: 485,636

Related U.S. Application Data

[63] Continuation of Ser. No. 107,515, Jan. 18, 1971, abandoned.

[30] Foreign Application Priority Data

Jan. 19, 1970 Japan .................................. 45-4451

[52] U.S. Cl. ............. 204/159.15; 156/99; 156/272; 117/93.31; 117/132 B; 117/14 B; 204/159.19; 204/159.23; 204/159.24; 260/22 TN; 260/30.6 R; 260/31.8 M; 260/338 UA; 260/75 MA; 260/75 NP; 260/77.5 AN; 260/77.5 CR; 260/836; 260/859 R

[51] Int. Cl. ......... B01j 1/10; C08d 1/10; B01l 1/12

[58] Field of Search ..... 204/159.15, 159.22, 159.23, 204/159.24, 159.19; 260/859 R, 77.5 CR

[56] References Cited

UNITED STATES PATENTS

| | | | |
|---|---|---|---|
| 3,694,415 | 9/1972 | Honda et al. | 260/77.5 CR |
| 3,719,638 | 3/1973 | Huemmer et al. | 360/77.5 CR |
| 3,759,809 | 9/1973 | Carlick et al. | 204/159.23 |

*Primary Examiner*—Murray Tillman
*Assistant Examiner*—Richard B. Turer
*Attorney, Agent, or Firm*—Sherman & Shalloway

[57] ABSTRACT

A photopolymerizable composition comprising (A) 100 parts by weight of a photopolymerizable prepolymer having isocyanate groups as well as one or more unsaturated addition-polymerizable double bonds, the prepolymer being one obtained by reacting a polyisocyanate compound, a polyhydroxy compound and an unsaturated addition-polymerizable compound having a hydroxyl group, and (B) 0.001 to 15 parts by weight of a photosensitizer. The photopolymerizable composition finds use as a paint material such as paints, printing ink, and plate making material, as well as an adhesive.

7 Claims, No Drawings

PHOTOPOLYMERIZABLE, ISOCYANATE-CONTAINING PREPOLYMERS

This is a continuation of application Ser. No. 107,515, filed Jan. 18, 1971, now abandoned.

This invention relates to new and valuable photopolymerizable compositions. More specifically, the invention relates to a photopolymerizable composition the principal constituent components of which are a photopolymerizable prepolymer and a photosensitizer.

Numerous photopolymerizable compositions i.e., compositions which on exposure to actinic rays in the presence of a photosensitizer set up a cross-linking reaction and become cured, have been known in the past (see U.S. Pat. Nos. 3,013,895, 3,448,089 and 3,450,612). However, in the case of these prior art photopolymerizable compositions, shrinkage takes place during the progress of the cross-linking reaction, with the consequence that an internal stress is set up, with the consequence that the adhesiveness between the substrate and the cured product derived from such a composition is inadequate. Accordingly, an improvement in this respect has been eagerly sought in those areas where especially great adhesive strength is required, such as in the case of coating materials and adhesives.

On the other hand, as disclosed in British Pat. specification No. 1,147,732, monomers which are cured by irradiation with high energy electron rays are known. These monomers can only be cured by utilizing a high energy ionizing radiation on the order of usually $10^5$ electron volts and cannot possibly be cured readily and economically in a short period of time, on the order of several minutes, at room temperature and even in open air by means of rays having an energy on the order of $10^1$ electron volts, for example, by exposure to ultraviolet rays.

An object of the present invention is therefore to eliminate all of the shortcomings and inconvenience such as are seen in the prior art and to provide a photopolymerizable composition which does not require a high energy radiation on the order of above $10^5$ electron volts for its cure but can be readily cured by exposure to a low energy on the order of $10^1$ electron volts at most, even in the presence of air, and moreover has, as one of its properties, the ability of forming a cured coating the adhesiveness of which is great when applied to a substrate.

Other objects and advantages of the invention will become apparent from the following description.

As a result of research with a view to attaining the foregoing objects, it has been found that a composition made up of predominantly a photopolymerizable prepolymer A having isocyanate groups and one or more unsaturated addition-polymerizable double bond and obtained by reacting a polyisocyanate compound, a polyhydroxy compound and an unsaturated addition-polymerizable compound having a hydroxyl group, and a photosensitizer B can be readily cured by exposure to low energy actinic rays even in the presence of air to provide a cured having great adhesiveness.

The polyisocyanate compound used for the preparation of the aforesaid photopolymerizable prepolymer A is a compound having at least two isocynate groups in its molecule. Included are, for example, 2,4-tolylene diisocyanate, 2,6-tolylene diisocyanate, meta-xylene diisocyanate, para-xylene diisocyanate, 3,3'-ditolylene-4,4'-diisocyanate, diphenylmethane-4,4'-diisocyanate, 3,3'-dimethyldiphenylmethane-4,4'-diisocyanate, 2,4-tolylene diisocyanate dimer, 1,5-naphthylene diisocyanate, 1,6-hexamethylene diisocyanate, lysine diisocyanate methyl ether, ω, ω'-dipropylether diisocyanate, dicyclohexylmethane-4,4'-diisocyanate, the triphenyl urethane reaction product obtained by reacting triol with 2,4-tolylene diisocyanate in a molar ratio of 1:3, the triphenyl urethane reaction product obtained by reacting trimethylolpropane and 2,4-tolylene diisocyanate in a molar ratio of 1:3, metaphenylene diisocyanate, and triphenylmethane-4,4', 4''-triisocyanate, which compounds may be used either singly or in combinations of two or more thereof.

On the other hand, the polyhydroxy compound used for preparing the aforesaid prepolymer A is a compound containing at least two hydroxyl groups in its molecule. Included are, for example, diols such as ethylene glycol, propylene glycol and 1,3-butylene glycol; trihydric or tetrahydric polyols such as glycerine, trimethylolethane, trimethylolpropane pentaerythritol and 1,2,6-hexanetriol; polyether type polyols such as polyethylene glycol, polypropylene glycol and polytetramethylene glycol; polyesters having terminal hydroxyl groups obtained by reacting adipic acid with diethylene glycol or maleic anhydric with ethylene glycol; partially esterified polyols such as fatty acid glycerides, trimethylolpropane monomethacrylate and trimethylolethane monomethacrylate; polyether type polyols obtained by reacting a polyhydroxy compound such as hereinbefore indicated with ethylene oxide or propylene oxide; and the condensation products obtained by reacting ethylene oxide or propylene oxide with ethylene diamine or ethanolamine. The foregoing compounds may be used either singly or as a mixture of two or more thereof.

As the unsaturated addition-polymerizable compound having a hydroxyl group, which is used for the preparation of the aforesaid prepolymer A, mention can be made of such, for example, as 2-hydroxyethyl acrylate, 2-hydroxyethyl methacrylate, 2-hydroxypropyl acrylate, 2-hydroxypropyl methacrylate, N-hydroxymethyl acrylamide, N-hydroxymethyl methacrylamide, diethylene glycol monoacrylate, diethylene glycol monomethacrylate, glycerine dimethacrylate, trimethylolpropane dimethacrylate, pentaerythritol trimethacrylate, polyethylene glycol monomethacrylate, polypropylene glycol monomethacrylate and the equimolar reaction product of glycidyl methacrylate and acrylic acid. These compounds may be used either singly or as a mixture of two or more thereof.

For preventing an undesirable reaction between the polyisocyanate compound and water in preparing the aforesaid prepolymer A, it is preferred to use the polyhydroxy compound and the unsaturated additionpolymerizable compound having a hydroxyl group in a water-removed anhydrous state.

As methods of preparing the aforesaid photopolymerizable prepolymer A three are conceivable: (I) a method which comprises reacting the polyisocyanate compound with the polyhydroxy compound in a first step to prepare an intermediate (I') having isocyanate groups, followed by reacting this intermediate (I') with the unsaturated additionpolymerizable compound having a hydroxyl group in a second step to prepare the prepolymer A; (II) a method which comprises reacting in a first step a portion of the polyisocyanate compound with the unsaturated addition-polymerizable compound having a hydroxyl group to prepare an intermediate (II') having isocyanate groups, reacting in a second step the so obtained intermediate (II') with the polyhydroxy compound to prepare an intermediate (II'') having a hydroxyl group and an unsaturated addition-polymerizable double bond, and thereafter reacting in a third step the so obtained intermediate (II'') with the remainder of the polyisocyanate compound to prepare the prepolymer A; and (III) a method of preparing the prepolymer A by reacting the three components, i.e., the polyisocyanate compound, the polyhydroxy compound and the unsaturated addition-polymerizable compound having a hydroxyl group, all at once. Of these three methods, method (II) is troublesome because of its greater number of steps. Therefore methods (I) and (III) are convenient in this respect.

As an aid to further the understanding of the foregoing modes of reaction, the instances of the preparation of prepolymer A using 3 mols of 2,4-tolylene diisocyanate, 1 mol of trimethylolpropane and 2 moles of 2-hydroxyethylmethacrylate, when expressed by equations, are as follows:

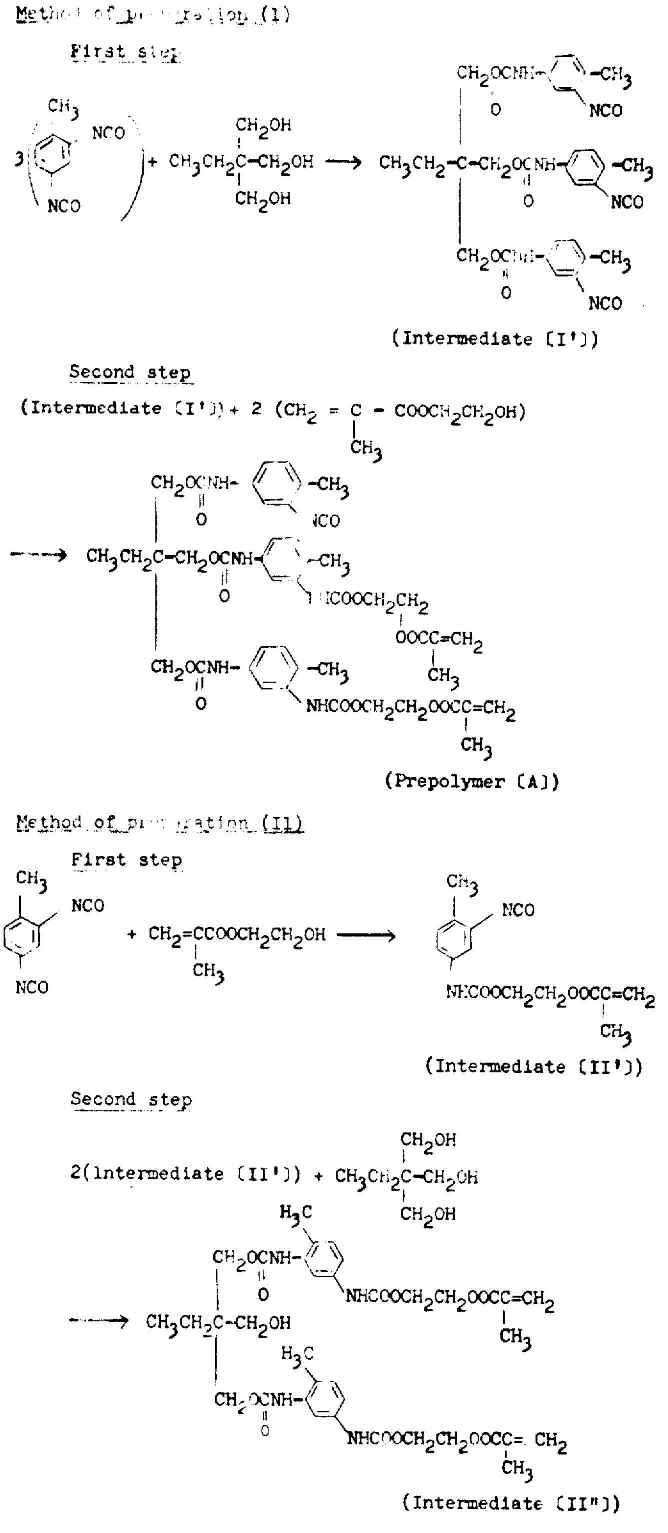

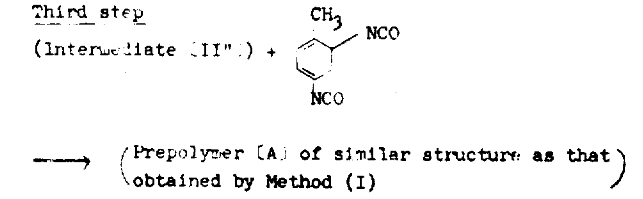

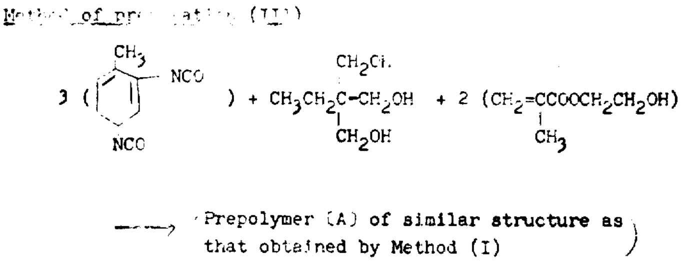

The foregoing reaction equations have skeletally shown the method of preparing the prepolymer A, the principal constituent component of the composition of the present invention. It will be readily appreciated by those skilled in the art that various by-products other than those indicated will be formed in an actual reaction.

Similarly, when prepolymer A is produced by using 3 mols of 2,4-tolylene diisocyanate, 1 mol of trimethylolpropane and 2.5 mols of 2-hydroxymethyl methacrylate, an equimolar mixture of the following two compounds can be obtained.

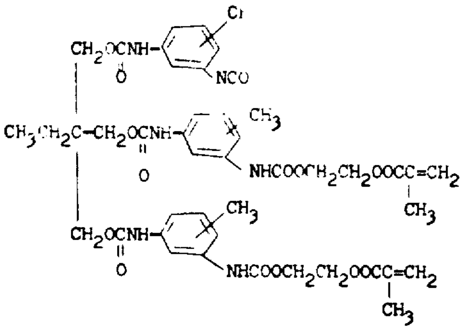

and

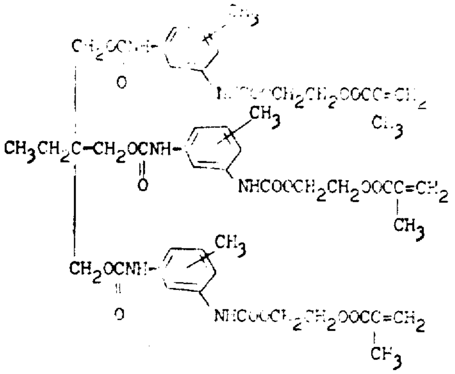

Thus, the "photopolymerizable prepolymer A having isocyanate groups and unsaturated addition-polymerizable double bonds" of the present invention also means a mixture of an unsaturated urethane compound having isocyanate groups in the molecule and an unsaturated urethane compound containing no isocyanate group.

Further, when 2 mols of trimethylolpropane, 2 mols of 1,2-propylene glycol, 7 mols of 2,4-tolylene diisocyanate and 2 mols of 2-hydroxyethyl methacrylate are used, for example, a prepolymer A conceivably having a structural formula such as hereinbelow indicated can be prepared.

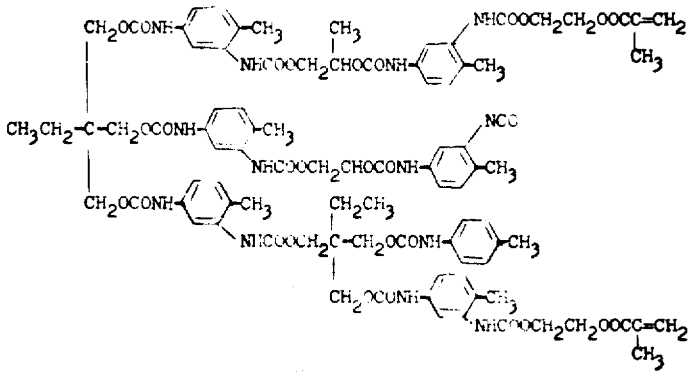

In order to obtained the composition of the present invention, i.e., a photopolymerizable composition having great adhesiveness, it is necessary when carrying out the reaction of forming the aforesaid photopolymerizable prepolymer A to blend the polyisocyanate compound, polyhydroxy compound and unsaturated addition-polymerizable compound having a hydroxyl group so that the number of isocyanate groups exceeds the number of hydroxyl groups. Further, while the molecular weight of the prepolymer A having isocyanate groups and the unsaturated polymerizable double bond can be adjusted by a suitable choice of the class of the polyisocyanate compound, polyhydroxy compound and unsaturated addition-polymerizable compound having a hydroxyl group and the proportion in which they are blended, a desirable molecular weight is 400 to 10,000, and preferably 500 to 5000. Again, while the proportion of the unsaturated addition-polymerizable double bond contained in the prepolymer A can be provided for in accordance with the curing conditions and the purpose for which the photopolymerizable composition is to be used, the usual amount is $3 \times 10^{-4}$ mol to $6 \times 10^{-3}$ mol per gram of the prepolymer A. For example, in the case of a photopolymerizable composition in which the prepolymer A is contained in an amount exceeding 90 % by weight based on the total amount of the prepolymer A and the photosensitizer B, or, as hereinafter described, in the case where conjoint use is made of an unsaturated addition-polymerizable monomer C, based on the total amount of A, B and C, at least one double bond in the molecule will do in the case of a prepolymer A having a molecular weight below 1500, and at least one double bond for each 1500 of the molecular weight of the prepolymer A will do in the case where the molecular weight of the prepolymer exceeds 1500. In short, the proportion in which the aforesaid double bond can be contained in the prepolymer A can be chosen within a broad range so long as it is one which does not cause gellation to take place during the preparation of the prepolymer A.

For carrying out the reaction smoothly in preparing the aforesaid photopolymerizable prepolymer A, a solvent or an unsaturated addition-polymerizable monomer C (which will be more fully described hereinbelow), which does not set up a reaction of the isocyanate with itself or with hydroxyl groups may be present in the reaction system. In this case, it is desirable that such a solvent or an unsaturated addition-polymerizable monomer c is used in a water-removed anhydrous state to prevent the setting up of an undesirable reaction between the polyisocyanate compound and water. When the foregoing solvent is removed from the reaction product completion of the reaction, it is preferably one having a low boiling point. Useable are such, for example as methyl ketone, ethyl acetate, propyl acetate, tetrahydrofuran, dioxane, diisopropyl ether, methyl isobutyl ketone, ethylene glycol monoethyl ether acetate, benzene and toluene. These solvents may be used either singly or as a mixture of two or more thereof.

While the reaction temperature used in preparing the photopolymerizable prepolymer A can be optionally selected, a high temperature is best used to carry out the reaction smoothly, with the limitation that it is one that does not set up a polymerization reaction of the unsaturated addition-polymerizable double bond that is present in the reaction system. However, the use of an unnecessarily high reaction temperature should be avoided, since this will result in the gellation of the reaction product. Usually a reaction temperature of 40°–100°C., and preferably 50°–80°C., is conveniently used. If necessary, a known catalyst such as a quaternary ammonium salt, a tertiary amine or an organotin compound may be present in the reaction system for accelerating the reaction.

Further, for preventing the setting up of a polymerization reaction of the unsaturated double bond contained in the unsaturated addition-polymerizable compound during the preparation of the prepolymer A, a polymerization inhibitor may be added to the reaction system in an amount of 0.001–1.000% based on the total weight of the prepolymer A and the unsaturated addition-polymerizable monomer C, which has been added to the reaction system as required. As such a polymerization inhibitor, mention can be made of such as benzoquinone, 2,5-diphenyl-benzoquinone, hydroquinone, hydroquinonemonomethyl ether, catechol and monotetiarybutylcatechol.

The photopolymerizable composition of the present invention uses besides the hereinbefore described photopolymerizable prepolymer A a photosensitizer B as a requisite component to ensure that the polymerization reaction is set up as a result of photoexcitation when exposed to actinic rays.

The prepolymer A is preferably present in the photopolymerizable composition in an amount of at least 30 % based on the total weight thereof. The photosensitizer B is used in an amount of 0.001 to 15 parts by weight per 100 parts by weight of the propolymer A when no unsaturated addition-polymerizable monomer C is present in the composition, and it is used in an amount of 0.001 to 30 parts by weight per 100 parts by weight of the prepolymer A when unsaturated addition-polymerizable monomers C are present in the composition.

While numerous classes of compounds are available for use as the photosensitizer B, especially effective are, for example, benzoin and derivatives thereof such as benzoin, benzoin methyl ether, benzoin ethyl ether, benzoin butyl ether and alpha-methyl benzoin, diketones such as benzyl and diacetyl; organic sulfides such as diphenylmonosulfide, diphenyldisulfide, desylphenylsulfide and tetramethylthiuram monosulfide; S-acyldithiocarbamate, such as S-benzoly-N,N-dimethyldithiocarbamate and S-(t-chlorobenzoyl)-N,N-dimethyldithiocarbamate; phenones such as acetophenone and benzophenone; and 2-naphthalene sulfonyl chloride and derivatives thereof.

The invention photopolymerizable composition can, as required, contain an unsaturated addition-polymerizable monomer C besides the hereinbefore described photopolymerizable prepolymer A and photosensitizer B. The unsaturated addition-polymerizable monomer C is a substance which polymerizes with the foregoing photopolymerizable prepolymer A and becomes cured integrally therewith. As the unsaturated addition-polymerizable monomer, useable are those monomers which do not react with the isocyanate group, examples being styrene, chlorostyrene, alpha-methylstyrene, divinylbenzene, methyl methacrylate, n-butyl methacrylate, n-butyl acrylate, nn-propyl acrylate, n-propyl methacrylate, isopropyl methacrylate, isopropyl acrylate, n-hexyl acrylate, 2-ethylhexyl acrylate, 2-ethylhexyl methacrylate, amyl acrylate, acrylonitrile, ethylene glycol dimethacrylate, ethylene glycol diacrylate, triethylene glycol dimethacrylate, triethylene glycol diacrylate, diallyl phthalate, diallyl isophthalate, vinyl acetate and vinyl butyrate. These unsaturated addition-polymerizable monomers may be used either singly or as a mixture of two or more thereof. Again, as previously noted, the unsaturated addition-polymerizable monomer C can be present in the reaction system as a substitute for a solvent in the preparation of the photopolymerizable prepolymer A, and in such a case it is preferred since it need not be removed from the reaction product upon completion of the reaction as in the case where other solvents have been used. Further, it is also possible to use as the aforesaid unsaturated addition-polymerizable monomer C those monomers which can react with the isocyanate group. For example, the unsaturated addition-polymerizable compound having a hydroxyl group, such as used in the preparation of the prepolymer A, or acrylic acid, methacrylic acid, acrylamide and methacrylamide are effectively used. However, when the foregoing unsaturated addition-polymerizable monomer which can react with the isocyanate group is used, it is necessary to ensure that after the reaction of the isocyanate groups contained in the prepolymer A with the functional groups (hydroxyl, carboxyl or carbonamide groups) contained in the unsaturated addition-polymerizable monomer, C the unreacted isocyanate groups contained in the prepolymer A are present in an amount of at least 0.3% based on the total weight of the prepolymer A, photosensitizer B and monomer C. In any event the proportion in which the unsaturated additionpolymerizable monomer C is used per 100 parts by weight of the photopolymerizable prepolymer A should be 1 to 200 parts by weight. When the proportion of the unsaturated addition-polymerizable monomer C is too great, undesirable effects occur in that the photocuring speed is retarded or a tendency to a decline in the mechanical strength or resistance to chemicals of the resulting photocured product appears.

The photopolymerizable composition thus contains a photopolymerizable prepolymer A and a photosensitizer B as essential components and an unsaturated addition-polymerizable monomer C as an optional component. Aside from the foregoing components, it can also contain optionally in suitable amounts high molecular compounds, plasticizers, fillers, colorants and extenders as in the case with the known customary formulations for paints and adhesives.

For example, for the reduction of manufacturing costs, or when being used as a paint material for improving the painting properties and the properties of the film coating, high molecular compounds may be added to the photopolymerizable composition. High molecular compounds suitable for this purpose include such as castor oil, polyether resins, polyvinylformal resins, epoxy resins, acrylic resins, polyester resins, polyethylene and waxes.

On the other hand, as the aforesaid plasticizers, mention can be made of such as dioctyl phthalate, dibutyl phthalate, butylphthalylbutylglycollate; tricresyl phosphate; chlorinated paraffin; and polyester or polyepoxy type plasticizers sold under the trademark "Admex" (produced by Ashland Chemical Co., U.S.A.).

Again, as the fillers, useable are glass fibers, powdered silica, calcium carbonate, etc.

In order to obtain a sufficient adhesiveness between the photo-cured products of the photopolymerizable composition and the substrate when the former is used as a paint material or adhesive, it is necessary to make the amount of isocyanate groups contained in the prepolymer A at least 0.3 %, based on the total weight of the components A, B and C in the photopolymerizable composition, by adjusting the ratio in which the aforesaid polyisocyanate compound, polyhydroxy compound and unsaturated addition-polymerizable compound having a hydroxyl group are blended as well as the conversion which the urethane reaction proceeds. On the other hand, the content of the isocyanate groups in an amount exceeding 15 % by weight also does not bring about an appreciable improvement in the adhesiveness between the photocured product and the substrate. Accordingly, the content of the isocyanate groups should range from 0.3 to 15 %, and preferably 0.8–10 %.

While the viscosity of the photopolymerizable composition can be suitably adjusted by adjusting the molecular weight of the photopolymerizable prepolymer A and the amount added, as required, of the unsaturated addition-polymerizable monomer (c), it usually should be 0.01–150 poises, and preferably 0.01–15 poises.

When the invention photopolymerizable composition is applied to a suitable substrate, e.g., a plastic film, sheet metal, wood, sheet glass or paper, by spraying, roller-coating, curtain coating, dipping, flow-spreading or brushing and thereafter exposed to actinic rays having a wavelength of 2000–7000 A using either an ultraviolet fluorescent lamp, mercury-vapor lamp or carbon arc, a cured coating having great adhesiveness is formed on the substrate. While the mechanism is not fully clear, it is imagined that in forming the cured coating by the polymerization of the photopolymerizable prepolymer A and the unsaturated addition-polymerizable monomer C (which has been added as required) by exposure of these components to actinic rays, a reaction takes place between the isocyanate groups contained in the prepolymer A and the small amount of either water or functional groups such as hydroxyl groups that are contained in the substrate, with the consequence that a strong chemical bond is formed within the interior of the cured coating and between the substrate and the cured coating.

This, since a photo-cured product having great adhesiveness is formed when the photopolymerizable composition is applied to a substrate, it is very valuable when used for paint materials and adhesives.

Accordingly, photopolymerizable composition of the present invention finds use in areas where full adhesive strength is required between the cured product and substrate, i.e. paint material such as paints, printing ink, and plate making material, as well as adhesives.

The following example will be given for specifically illustrating the invention.

EXAMPLE 1

104.4 Grams (0.6 mol) of tolylene diisocyanate [2,4-tolylene diisocyanate/2,6-tolylene diisocyanate = 95/5 (wt. ratio)] were heated to 70°C., and while ensuring that this temperature was not exceeded, a homogeneously mixed solution heated to 70°C. consisting of 26.8 grams (0.2 mol) of trimethylolpropane, 79.0 grams of methyl methacrylate and 0.02 gram of p-benzoquinone was added dropwise during a 2-hour period, following which the reaction was contained for a further 6 hours. This was followed by adding dropwise 57.2 grams (0.44 mol) of 2-hydroxyethyl methacrylate during a period of 0.5 hour, after which the reaction was continued for a further 10 hours, followed by the addition of 43.0 grams of methyl methacrylate to obtain a methyl methacrylate solution of a light yellow, transparent photopolymerizable prepolymer A containing 1.8% by weight of isocyanate groups.

3.1 Grams of benzoin methyl ether were added to the so obtained prepolymer solution followed by homogeneously mixing to prepare the photopolymerizable composition of the present invention.

The so prepared photopolymerizable composition was applied to a wooden test piece having a smooth surface at the rate of 100 grams per square meter. The coated surface was covered with a 30-mm-thick untreated polyethylene film excercising care to ensure that no air bubbles were permitted to enter. This was then exposed to actinic rays with a 2-KW high pressure mercury-vapor lamp for 30 seconds at a radiation distance of 30 cm. The polyethylene film was then stripped and a smooth cured coating was obtained. The Sward hardness of this coating was 28 and the fastness of adherence of the coating was very excellent, its adhesion strength being 10.5 kg/cm². Its resistance to abrasion and chemicals as well as other properties were also satisfactory.

Separately, a methyl methacrylate solution of a light yellow prepolymer containing 0.1% by weight of isocyanate groups was obtained by following the procedure described above, except that the amount of 2-hydroxyethyl methacrylate used was 78 grams (0.6 mol).

A control photopolymerizable composition was prepared by adding 3.3 grams of benzoin methyl ether to this prepolymer solution and homogeneously mixing.

Using the so prepared photopolymerizable composition, a smooth cured coating was formed on a wooden test piece following the same procedure described above. While the coating properties such as hardness (Sward hardness of 26), and resistance to abrasion and chemicals of this cured coating were either comparable or only somewhat inferior to the cured coating previously described, the fastness of adherence of this coating was very inferior to that of the hereinbefore described cured coating, the adhesion strength in this case being only 2.2 kg/cm². It was thus found that the photopolymerizable composition of the present invention was greatly superior in this respect.

EXAMPLE 2

A combined solution consisting of 30 grams of methyl methacrylate, 40 grams of butyl acrylate, 0.5 gram of lauryl mercaptan and 0.025 gram of azoisobutyronitrile was heated to 80°C. while blowing in nitrogen, after which the reaction was carried out for a further 1.5 hours while ensuring that this temperature was not exceeded. Then a solution in 30 grams of methyl methacrylate of 0.01 gram of hydroquinone was added to the reaction mixture followed by rapidly cooling the mixture to prepare an acrylic syrup containing 33% of non-volatile components.

Seventy grams of the so obtained acrylic syrup and 30 grams of the photopolymerizable composition prepared in Example 1 were mixed, to which were then added and homogeneously mixed 0.2 gram of benzoin methyl ether and a colorant 0.3 gram of a dyestuff "Neo-ZAPON Yellow G.R." (product of BASF) to prepare a photopolymerizable composition. When the so prepared photopolymerizable composition was used and two sheets of glass wee adhered together and exposed for 30 seconds from a radiation distance of 20 cm to actinic rays using an 800-W high pressure mercury-vapor lamp, the yellow resin was completely cured, with the result that the two sheets of glass were firmly bonded.

EXAMPLE 3

A combined solution consisting of 261 grams (1.5 mols) of tolylene diisocyanate, 46 grams (0.5 mol) of glycerine, 132 grams of methyl methacrylate, 0.05 gram of p-benzoquinone and 50 grams of ethyl acetate was heated to 70°C., after which the reaction was continued for a further 5 hours while ensuring that this temperature was not exceeded. Then the ethyl acetate was removed under reduced pressure. Next, 130 grams (1.0 mol) of 2-hydroxyethyl methacrylate were added dropwise during a 0.5-hour period, followed by continuing the reaction for a further 6 hours and thereafter adding 159 grams of methyl methacrylate to obtain a methyl methacrylate solution of a light yellow, transparent photopolymerizable prepolymer A containing 2.2% of isocyanate groups.

7.3 Grams of diphenyl disulfide were added to the so obtained prepolymer solution and homogeneously mixed therewith to prepare the photopolymerizable composition.

The so prepared photopolymerizable composition was used and a cured coating was made on a wooden test piece by following the procedure described in Example 1. The Sward hardness of the cured coating was 25 and the fastness of adherence of the coating as indicated by its adhesion strength was 9.6 kg/cm². Furthermore, the resistance to abrasion and chemicals of this coating as well as its other properties were satisfactory.

EXAMPLE 4

156.5 Grams (0.9 mol) of tolylene diisocyanate, 121 grams of methyl methacrylate and 0.025 gram of p-benzoquinone were heated to 70°C., and while ensuring that this temperature was not exceeded 40.2 grams (0.3 mol) of 1,2,6-hexane triol were added dropwise during a 2-hour period. The reaction was then continued for a further 6 hours. Next, after adding dropwise 86.4 grams (0.6 mol) of 2-hydroxypropyl methacrylate during a 0.5-hour period, the reaction was carried out for a further 8 hours, followed by adding 68 grams of methyl methacrylate to obtain a methyl methacrylate solution of a light yellow, transparent photopolymerizable prepolymer containing 2.6% by weight of isocyanate groups.

To the so obtained prepolymer solution were added 4.9 grams of benzoin methyl ether, 4.9 grams of benzopenone, 9.8 grams of dibutyl phthalate and 50 grams of ethyl acetate, followed by homogeneously mixing the mixture to prepare the photopolymerizable composition of the present invention.

When the so prepared photopolymerizable composition was applied to an aluminum plate at a thickness of 75 microns and exposed for 10 seconds to actinic rays from a radiation distance of 30 cm, using a 2-KW high pressure mercury-vapor lamp, the surface as well as the interior of the resinous layer on the aluminum plate was completely cured. Separately, the composition was applied at the rate of 100 g/m² to a wooden test piece having a smooth surface and likewise exposed for 15 seconds to actinic rays from a radiation distance of 30 cm, allowed to stand for 2 minutes, and again exposed for 15 seconds, with the result that a coating whose surface as well as interior was completely cured was formed. The so formed cured coating had a Sward hardness of 24 and its fastness of adherence as indicated by its adhesion strength of 11.2 kg/cm² was excellent. Its other properties such as abrasion resistance and resistance to chemicals were also satisfactory.

EXAMPLE 5

An unsaturated polyester resin having an acid value of 40 was prepared in customary manner from 1.0 mol of phthalic anhydride, 1.0 mol of maleic anhydride and 2.1 mols of 1,2-propylene glycol, after which the so prepared resin was stabilized by the addition of 0.01% by weight of hydroquinone. Styrene was dissolved therein to prepare a styrene solution of an unsaturated polyester resin containing 65% of volatile components. Twenty grams of this solution and 80 grams of the photopolymerizable composition prepared in Example 4 were mixed, after which 0.2 gram of benzoin methyl ether and 0.1 gram of 125°F. paraffin wax were added to the mixture and homogeneously mixed therewith to prepare a photopolymerizable composition. The so prepared photopolymerizable composition was used and a wooden test piece having a smooth surface was coated with this composition and exposed in Example 4, with the consequence that a cured coating whose surface as well as interior was completely cured was formed. The Sward hardness of this cured coating was 25 and its fastness of adherence was excellent as indicated by its adhesion strength of 10.2 kg/cm². Its resistance to abrasion and chemicals as well as other properties were also very satisfactory.

EXAMPLE 6

151 Grams (0.9 mol) of hexamethylene diisocyanate were heated to 70°C., and while ensuring that this temperature was not exceeded a homogeneous combined solution consisting of 40.1 grams (0.3 mol) of trimethylolpropane, 114 grams of ethyl methacrylate and 0.02 gram of p-benzoquinone and heated in advance to 70°C. was added dropwise during a 2-hour period, followed by the continuation of the reaction for a further 6 hours. This was followed by adding dropwise a liquid mixture consisting of 39.0 grams (0.3 mol) of 2-hydroxyethyl methacrylate and 34.8 grams (0.3 mol) of 2-hydroxyethyl acrylate during a 0.5-hour period, followed by continuing the reaction for a further 8 hours to obtain an ethyl methacrylate solution of a light yellow, transparent photopolyzable prepolymer A containing 3.3% by weight of isocyanate groups. The invention photopolymerizable composition was prepared by adding to the so obtained prepolymer solution 3.7 grams of benzoin ethyl ether and homogeneously mixing the two components. Two sheets of cellophane film were adhered using the so prepared photopolymerizable composition and exposed for 30 seconds to actinic rays from a radiation distance of 20 cm using an 800-W high pressure mercury-vapor lamp, with the result that the resinous layer between the films was completely cured. A strong adhesive force of 295 g/cm was obtained between the two sheets of film.

EXAMPLE 7

A combined solution consisting of 200 grams (0.5 mol) of propylene glycol of molecular weight 400, 174 grams (1.0 mol) of tolylene diisocyanate, 78 grams (0.6 mol) of 2-hydroxyethyl methacrylate and 0.01 gram of p-benzoquinone was reacted for 10 hours while ensuring that a temperature of 70°C. was not exceeded to obtain a light yellow, transparent photopolymerizable prepolymer A containing 4.0% by weight of isocyanate groups.

4.2 Grams of benzoin methyl ether were added to the so obtained prepolymer and homogeneously mixed therewith to prepare the invention photopolymerizable composition.

When the so prepared photopolymerizable composition was used and two sheets of glass were adhered and exposed for 30 seconds to actinic rays from a radiation distance of 20 cm using an 800-W high pressure mercury-vapor lamp, the resinous layer was completely cured and the two sheets of glass were firmly bonded.

We claim:

1. A photopolymerizable composition consisting essentially of:

a. photopolymerizable prepolymer having isocyanate group and at least one unsaturated addition-polymerizable double bond, said prepolymer being obtained by reacting
   i. a polyisocyanate compound selected from organic di- and triisocyanates, with
   ii. a polyhydroxy compound selected from the group consisting of diols, trihydric polyols, tetrahydric polyols, polyester type polyols, polyether type polyols and partially esterified products having at least two hydroxyl groups obtained by reacting a tri-tetrahydric polyol with a monocarboxylic acid, at such a ratio that the hydroxyl group is less than one equivalent with respect to one equivalent of the isocyanate group, and then reacting the reaction product with
   iii. an unsaturated addition-polymerizable compound having a hydroxyl group selected from the group consisting of partially esterified products obtained by reacting a diol with acrylic acid or methacrylic acid, partially esterified products obtained by reacting a diol with acrylic acid or methacrylic acid, partially esterified products obtained by reacting a tri- or tetrahydric polyol with acrylic acid or methacrylic acid, partially esterified products obtained by reacting a polyether type polyol with acrylic acid or methacrylic acid, N-hydroxy-methyl-acrylamide and N-hydroxymethyl-methacrylamide, at such a ratio that the hydroxyl group is less than one equivalent with respect to one equivalent of the isocyanate group remaining in the reaction product; and b. 0.001 to 15 parts by weight of a photosensitizer per 100 parts by weight of (a), the amount of isocyanate groups contained in said prepolymer being 0.3 to 15% based on the total weight of said components (a) and (b).

2. A photopolymerizable composition consisting essentially of:

a. photopolymerizable prepolymer having isocyanate group and at least one unsaturated addition-polymerizable double bond, said prepolymer being obtained by reacting
   i. a polyisocyanate compound selected from organic di- and triisocyanates, with
   ii. a polyhydroxy compound selected from the group consisting of diols, trihydric polyols, tetrahydric polyols, polyester type polyols, polyether type polyols and partially esterified products having at least two hydroxyl groups obtained by reacting a tri-tetrahydric polyol with a mono-carboxylic acid, at such a ratio that the hydroxyl group is less than one equivalent with respect to one equivalent of the isocyanate group, and then reacting the reaction product with iii. an unsaturated addition-polymerizable compound having a hydroxyl group selected from the group consisting of partially esterified products obtained by reacting a diol with acrylic acid or methacrylic acid, partially esterified products obtained by reacting a tri- or tetrahydric polyol with acrylic acid or methacrylic acid, partially esterified products obtained by reacting a polyether type polyol with acrylic acid or methacrylic acid, N-hydroxymethyl-acrylamide and N-hydroxymethyl-methacrylamide, at such a ratio that the hydroxyl group is less than one equivalent with respect to one equivalent of the isocyanate group remaining in the reaction product;

b. 0.001 to 30 parts by weight of a photosensitizer per 100 parts by weight of (a); and c. 1 to 200 parts per 100 parts by weight of (a) of an unsaturated addition-polymerizable monomer, the amount of isocyanate groups contained in said prepolymer (a) being 0.3 to 15% based on the total weight of said components (a), (b) and (c).

3. A photopolymerizable composition consisting essentially of:

a. photopolymerizable prepolymer having isocyanate group and at least one unsaturated addition-polymerizable double bond, said prepolymer being obtained by reacting i. a polyisocyanate compound selected from organic di- and triisocyanates, with ii. a polyhydroxy compound selected from the group consisting of diols, trihydric polyols, tetrahydric polyols, polyester type polyols, polyether type polyols and partially esterified products having at least two hydroxyl groups obtained by reacting a tritetrahydric polyol with a mono-carboxylic acid, at such a ratio that the hydroxyl group is one equivalent with respect to two equivalents of the isocyanate group, and then reacting the reaction product with iii. an unsaturated addition-polymerizable compound having a hydroxyl group selected from the group consisting of partially esterified products obtained by reacting a diol with acrylic acid or methacrylic acid, partially esterified products obtained by reacting a tri- or tetrahydric polyol with acrylic acid or methacrylic acid, partially esterified products obtained by reacting a polyether type polyol with acrylic acid or methacrylic acid, N-hydroxymethyl-acrylamide and N-hydroxymethyl-methacrylamide, at such a ratio that the hydroxyl group is less than one equivalent with respect to one equivalent of the isocyanate group remaining in the reaction product; and b. 0.001 to 15 parts by weight of a photosensitizer per 100 parts by weight of (a), the amount of isocyanate groups contained in said prepolymer being 0.3 to 15% based on the total weight of said components (a) and (b).

4. A photopolymerizable composition consisting essentially of:

a. photopolymerizable prepolymer having isocyanate group and at least one unsaturated addition-polymerizable double bond, said prepolymer being obtained by reacting i. a polyisocyanate compound selected from organic di- and triisocyanates with ii. A polyhydroxy compound selected from the group consisting of diols, trihydric polyols, tetrahydric polyols, polyester type polyols, polyether type polyols and partially esterified products having at least two hydroxyl groups obtained by reacting a tri-tetrahydric polyol with a mono-carboxylic acid, at such a ratio that the hydroxyl group is one equivalent with respect to two equivalents of the isocyanate group, and then reacting the reaction product with iii. an unsaturated addition-polymerizable compound having a hydroxyl group selected from the group consisting of partially esterified products obtained by reacting a diol with acrylic acid or methacrylic acid, partially esterified products obtained by reacting a tri- or tetrahydric polyol with acrylic acid or methacrylic acid, partially esterified products obtained by reacting a polyether type polyol with acrylic acid or methacrylic acid, N-hydroxymethyl acrylamide and N-hydroxymethyl methacrylamide, at such a ratio that the hydroxyl group is less than one equivalent with respect to one equivalent of the isocyanate group remaining in the reaction product;

b. 0.001 to 30 parts by weight of a photosensitizer per 100 parts by weight of (a); and c. 1 to 200 parts per 100 parts by weight of (a) of an unsaturated addition-polymerizable monomer, the amount of isocyanate groups contained in said prepolymer (a) being 0.3 to 15% based on the total weight of said components (a), (b) and (c).

5. A photopolymerizable composition according to claim 3 characterized by a photopolymerizable prepolymer being a compound represented by the following general formula:

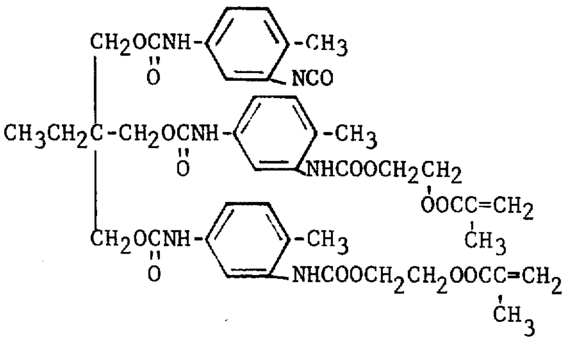

6. A photopolymerizable composition according to claim 3 characterized by a photopolymerizable prepolymer being a mixture of two types of compound represented by the following formulae:

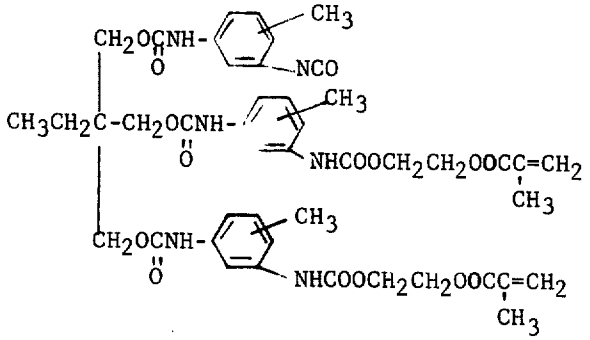
and
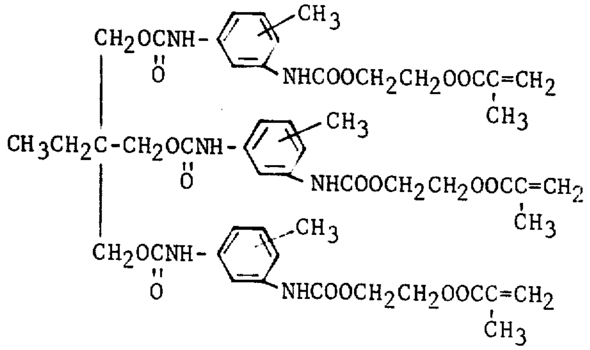
7. A photopolymerizable composition according to claim 3 characterized by a photopolymerizable prepolymer being a compound represented by the following general formula:
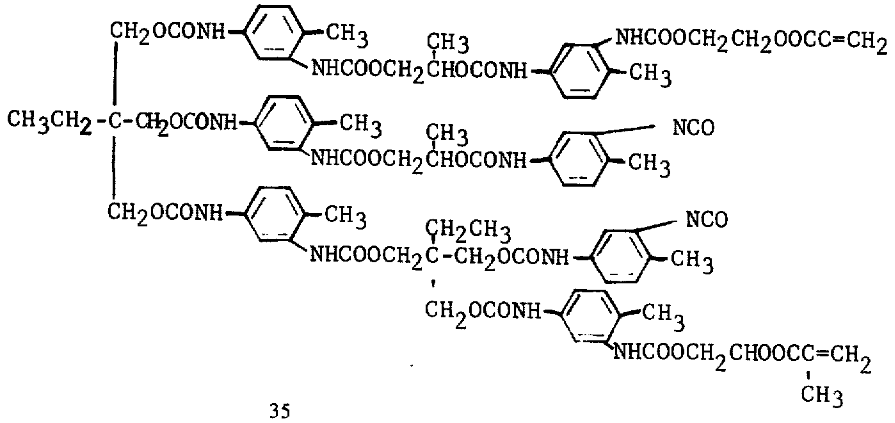
* * * * *